United States Patent
Miura (10) Patent No.: US 6,802,731 B2
(45) Date of Patent: Oct. 12, 2004

(54) CONTACT PIN AND SOCKET FOR ELECTRICAL PARTS

(75) Inventor: Akira Miura, Kawaguchi (JP)

(73) Assignee: Enplas Corporation, Kawaguchi (JP)

( * ) Notice: Subject to any disclaimer, the term of this patent is extended or adjusted under 35 U.S.C. 154(b) by 0 days.

(21) Appl. No.: 10/150,999

(22) Filed: May 21, 2002

(65) Prior Publication Data

US 2002/0177342 A1 Nov. 28, 2002

(30) Foreign Application Priority Data

May 22, 2001 (JP) .......................................... 2001-152925
May 28, 2001 (JP) .......................................... 2001-158524

(51) Int. Cl.[7] .............................................. H01R 11/22
(52) U.S. Cl. ........................ 439/266; 439/862; 439/330
(58) Field of Search .............................. 439/266, 862, 439/330, 72, 525, 526, 816; 438/754, 687; 29/874, 876, 884; 264/341

(56) References Cited

U.S. PATENT DOCUMENTS

| | | | | |
|---|---|---|---|---|
| 3,905,907 A | * | 9/1975 | Shiga | 252/79.4 |
| 4,551,292 A | * | 11/1985 | Fletcher et al. | 264/139 |
| 5,443,396 A | * | 8/1995 | Tokushige | 439/266 |
| 5,713,751 A | * | 2/1998 | Fukunaga | 439/266 |
| 5,864,946 A | * | 2/1999 | Eldridge et al. | 29/843 |
| 5,908,324 A | * | 6/1999 | Ohshima et al. | 439/266 |
| 5,936,418 A | * | 8/1999 | Ideta et al. | 324/755 |
| 6,019,671 A | * | 2/2000 | Shendon | 451/288 |
| 6,213,803 B1 | * | 4/2001 | Kato et al. | 439/266 |

* cited by examiner

Primary Examiner—P. Austin Bradley
Assistant Examiner—Edwin A. Leon
(74) Attorney, Agent, or Firm—Staas & Halsey LLP (57) ABSTRACT

An electrically conductive contact pin including an elastically deformable portion and a contact portion formed on a tip end portion of the elastic portion and adapted to contact an IC package lead. The contact portion is polished.

28 Claims, 5 Drawing Sheets

CONTACT PIN AND SOCKET FOR ELECTRICAL PARTS

BACKGROUND OF THE INVENTION

Field of the Invention

The present invention relates to a contact pin utilized for a socket for electrical parts for detachably accommodating and holding an electrical part such as a semiconductor device (called as "IC package" hereinlater), and also related to a socket for electrical parts provided with such contact pin.

Related Art of the Invention

In a known art, there has been provided an IC socket, as "socket for electrical parts" mentioned above, for carrying out performance test of an IC package as "electrical part", which is preliminarily disposed on a printed circuit board and in which an IC package is accommodated in this IC socket to thereby establish an electrical connection between the IC package and the printed circuit board.

As such IC package, there is provided one having, for example, a rectangular body having a side portion from which a number of terminals extends sideways.

Under the state that the IC package is accommodated in the IC socket, when contact portions of contact pins of the IC socket contact a number of terminals of the IC package, respectively, the terminals and the printed circuit board are electrically connected through the contact pins.

Such contact pin is formed by being punched out from a metal thin plate having conductivity, by means of press working, for example, and under the punched-out condition, the punched-out, i.e., cut, portion has a rough surface condition.

When the IC package is accommodated in the IC socket, a contact portion of a contact pin contacts a terminal of the IC package and slightly slides (wipes). According to this motion, a plating surface (layer) of the terminal is slightly cut to thereby remove an oxidation film or the like on that surface and, hence, make good the conductivity between the contact portion of the contact pin and the terminal of the IC package.

However, in the known structure mentioned above, at a time when the rough or course cut surface is provided to the contact portion of the contact pin at the time of punching out the contact pin from the metal thin plate, a solder will be easily transferred to the surface of the contact portion in a case where the terminal of the IC package is plated with a solder. This will result in the difficulty for maintaining, in good condition, the stable contact state between the contact portion of the contact pin and the terminal of the IC package for a long term. Furthermore, in a case where the plating of the terminal of the IC package is, for example, palladium plating, applicable to a lead-free requirement, the plating (plated) layer will provide a thin thickness in comparison with the solder plating, so that there is a fear that the plating layer is broken and the base surface of the terminal is exposed, providing inconvenience and being defective.

SUMMARY OF THE INVENTION

An object of the present invention is to substantially eliminate defects or drawbacks encountered in the prior art mentioned above and to provide a contact pin used for a socket for electrical parts capable of maintaining, in good condition, a stable contact state between a contact portion of a contact pin and a terminal of an electrical part for a long term and preventing breakage of a plating layer of the terminal, and also provide a socket for electrical parts having the contact pin having the improved structure mentioned above.

This and other objects can be achieved according to the present invention by providing, in one aspect, a contact pin for an electrical part formed from a metal material having conductivity and having a contact portion contacting a terminal of the electrical part, wherein the contact portion is polished by polishing means.

According to this aspect, the contact portion of the contact pin is polished by the suitable polishing means, and accordingly, in a case where the contact portion of the contact pin slides on the terminal of the electrical part, the plating layer formed on the terminal can be prevented from being broken and the lead base material thereof can be also prevented from being exposed outside. Moreover, a transferring amount of the solder can be controlled, so that the contact stability can be effectively maintained.

In a preferred embodiment of this aspect, the polishing of the contact portion is performed without applying any external force thereto. The polishing is a chemical polishing. A nickel plating is effected to the contact portion to which the chemical polishing has been made.

The terminal of the electrical part on which the contact portion of the contact pin slides is effected with a plating layer having a thickness of not more than 1 $\mu$m.

The polished contact portion has a surface roughness which is smaller than a thickness of a plating layer formed on the terminal.

According to the preferred embodiment mentioned above, the contact pin even being small in size and weak in strength can be polished without deforming the same, by such as chemical polishing, by applying no external mechanical force. According to the chemical polishing treatment, a number of contact pins can be polished at the same time by, for example, dipping them in a polishing solution, thus improving the workability for manufacturing the contact pins. The nickel plating will compensate the reduction in thickness of the contact pin including the elastic portion through the polishing treatment and, hence, the elastic strength of the elastic portion will be maintained.

Furthermore, when the contact portion, which has been polished, slides on the terminal to which the plating is effected to provide a thickness of not more than 1 $\mu$m, the peeling-off of the plating surface can be effectively prevented by the polished surface of the contact pin. Still furthermore, by setting the surface roughness of the contact portion polished by the polishing means to be less than a thickness of the plating layer of the terminal, the peeling-off of the plating layer will be effectively prevented.

In a modification of the above aspect of the present invention, there is also provided a contact pin for a socket for an electrical part formed from a metal material having conductivity, comprising:

a base portion;

a stationary piece extending from the base portion and contacting the electrical part; and a movable piece extending from the base portion and contacting the electrical part, the movable piece comprising an elastic portion and a contact portion contacting the electrical part, the contact portion being polished.

In another aspect of the present invention, there is also provided a socket for an electrical part having a terminal comprising:

a socket body to which an electrical part is mounted;

an operation member provided for the socket body to be vertically movable in an operative state, the operation member being formed with a cam portion;

a contact pin provided for the socket body, the contact pin being formed from a metal material having conductivity and comprising an elastic portion elastically deformable, a contact portion formed on a tip end portion of the elastic portion and adapted to contact the terminal of an electrical part, and an operation piece to be pressed by the cam portion of the operation member, the contact portion being polished by polishing means, the elastic portion being elastically deformed when the operation member is moved downward and the operation piece of the contact pin is pressed by the cam portion of the operation member to thereby separate the contact portion from the terminal of the electrical part.

In this aspect, the socket may be an IC socket provided with a number of contact pins and the electrical part may be an IC package provided with a number of IC leads as the terminals.

The nature and further characteristic features of the present invention will be made more clear from the following descriptions made with reference to the accompanying drawings.

DESCRIPTION OF THE PREFERRED EMBODIMENTS

Preferred embodiments of the present invention will be described hereunder with reference to the accompanying drawings of FIGS. 1 to 5.

Figure 1:
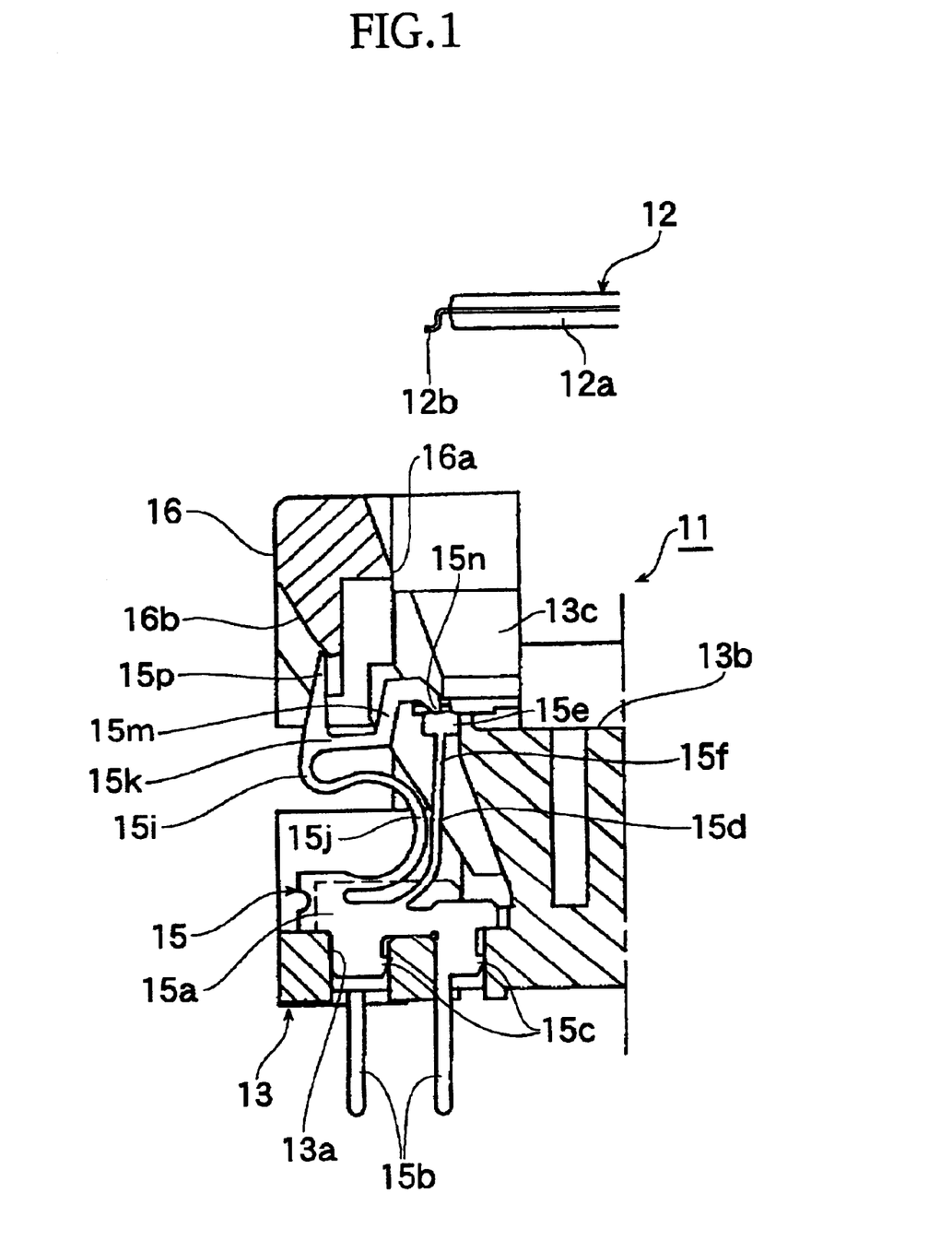
FIG. 1 is a sectional view of an IC socket provided with a contact pin according to an embodiment of the present invention and showing a state that a movable piece of the contact pin is closed.

With reference to FIG. 1, an IC socket as "a socket for electrical parts" is totally designated by reference numeral 11, and the IC socket 11 is utilized for electrical connection between an IC lead 12b as "a terminal" for an IC package 12 as "an electrical part" and a printed circuit board, not shown of a tester, in order to carry out a performance test of the IC package 12.

The IC package 12 is, as shown in FIG. 1, so-called a gull-wing-type, having a structure in which a number of IC leads 12b projects sideways from a rectangular package body 12a of the IC package 12. This IC lead 12b has a base (mother) material formed from a copper alloy according to a lead-free requirement, and a palladium plating layer having a thickness of about 1 $\mu$m is formed on the copper alloy material surface.

On the other hand, the IC socket 11 generally has a socket body 13 to be mounted on a printed circuit board, not shown, and the socket body 13 is formed with a number of contact pins 15 which is elastically deformable and connected to be electrically conductive to the IC leads 12b. The socket body 13 is also provided with an operation member 16 having a rectangular frame structure to be vertically movable so as to elastically deform the contact pins 15.

The socket body 13 is formed with press-in holes 13a into which the contact pins 15 are pressed and formed, at its upper surface, with an accommodation portion 13b in which the IC package 12 is mounted and accommodated. Furthermore, guide portions 13c are also formed on portions of the accommodation portion 13b, corresponding to corner portions of the IC package body 12a, for positioning the IC package 12 to a predetermined position.

Further, it is to be noted that terms such as "upper (upward)", "lower (downward)", and the like are used herein with reference to the illustration of the figures or in a general usable state of the socket.

The contact pin 15 has a springy property and is formed from a metal material having an excellent electrical conductivity. The contact pin 15 is press-fitted into the press-in hole 13a of the socket body 13. A number of such contact pins 15 is arranged side by side.

Figure 2:
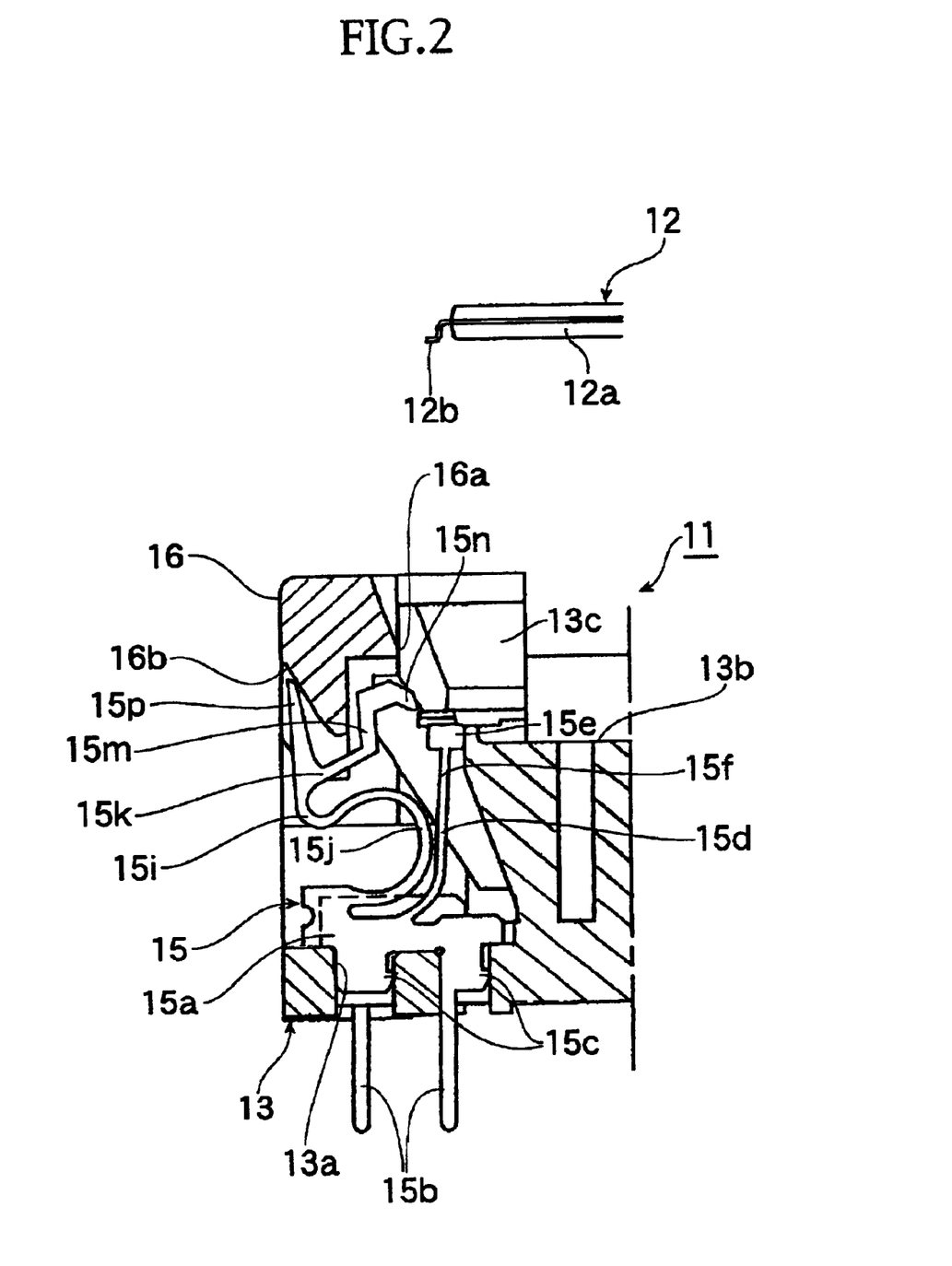
FIG. 2 is also a sectional view of the IC socket of FIG. 1 showing a state that the movable piece is opened.

More specifically, in the state illustrated in FIG. 1 or 2, each of the contact pins 15 has a base portion 15a from which a lead portion 15b extends downward, and the lead portion 15b has a root to which is formed a claw portion 15c which is press-contacted to an inner wall section of the press-in hole 13a of the socket body 13. The lead portion 15b has a part projecting downward from the socket body 13, which is then electrically connected to the printed circuit board.

Furthermore, a stationary contact piece 15d is formed on the upper portion of the base portion 15a so as to extend upward, and this stationary contact piece 15d is composed of an elastic portion 15f extending upward from the base portion 15a and a stationary contact portion 15e formed at the top end side of the elastic portion 15f so as to contact the lower surface side of the IC lead 12b.

Still furthermore, outside the stationary contact piece 15d (left side as viewed in FIG. 1), is disposed a movable contact piece 15i so as to extend upward. This movable contact piece 15i is composed of a curved elastic portion 15j, a movable piece 15k continuous to the curved elastic portion 15j and an arm portion 15m formed on the movable piece 15k so as to extend inward. The arm portion 15m has, at a front end portion, a movable contact portion 15n so as to contact the upper surface of the IC lead 12b. According to the structure mentioned above, the IC lead 12b of the IC package 12 is clamped from the upper and lower sides by the movable contact portion 15n and the stationary contact portion 15e. Further, the movable piece 15k is provided with an operation piece 15p so as to extend upward.

On the other hand, as shown in FIG. 1, the operation member 16 has an opening 16a of a size capable of the IC package 12 being inserted, and the IC package 12 inserted through this opening 16a is mounted on the accommodation portion 13b of the socket body 13. The operation member 16 is provided for the socket body 13 to be vertically movable and is urged upward by means of spring, not shown.

Furthermore, the operation member 16 is formed with a cam portion 16b, which contacts the operation piece 15p of the contact pin 15 in a slidable manner. When the operation member 16 is lowered, the operation piece 15p is pressed by the cam portion 16b of the operation member 16 and the elastic portion 15j is then deformed elastically, and as shown in FIG. 2, the movable piece 15k is deformed in an obliquely outside upward direction to be opened. Accordingly, the movable contact portion 15n is moved so as to be separated from the IC lead 12b. Further, when the operation member 16 is moved upward, an operation reverse to that mentioned above will be performed. That is, the movable contact portion 15n is deformed in an obliquely inward downward direction by the elastic urging force of the elastic portion 15j and the IC lead 12b is clamped between the movable contact portion 15n and the stationary contact portion 15e to thereby establish an electrical connection therebetween. At this clamping operation, the movable contact portion 15n is slightly slid on the IC lead 12b.

In an actual arrangement, a number of contact pins 15, each having the structure mentioned above, is arranged. Each of the contact pins 15 is formed in the following manner.

That is, a thin metal plate of, for example, copper alloy, having an excellent conductivity is punched out to provide a predetermined shape through a press working. The thus punched out piece is chemically treated to be polished by polishing means so as to provide cut portions including the movable contact portion 15n and the elastic portion 15j having a surface roughness L of a value less than that at the time of punch press working, for example, not more than 1 µm, that is, not more than the thickness of the palladium plating layer of the IC lead 12b. (see FIG. 5).

The contact pin 15 of the structure mentioned above will be manufactured or formed by the following method or process.

At first, a thin metal plate, as a metal material, of copper alloy is punched out, through the press working, into a predetermined shape and then is subjected to a chemical polishing.

The chemical polishing is performed by dipping the metal material into a mixed solution of a strong acid solution and a solution having a strong oxidation force to thereby provide gloss and smoothness to the surface of the metal material.

In the present invention, the punched-out copper alloy thin plate is dipped into a mixed solution consisting of sulfuric acid solution (100–200 g/l), hydrogen peroxide solution (30–70 g/l), as main component, and a saturated alcohol solution (small amount) at a solution temperature of 20–40° C. for 20 to 120 sec.

In other words, in this chemical polishing treatment, it is necessary to set a condition of the chemical polishing treatment such that the surface roughness L of the surface of the movable contact portion 15n of the contact pin 15 is less than the thickness (1 µm) of the plating layer of the IC lead 12b of the IC package 12. With such setting of the treatment condition, the chemical polishing is executed.

Thereafter, nickel plating is effected to the copper alloy material surface and a gold plating is then effected to this nickel plated surface to thereby form a contact pin 15.

According to the structure mentioned above, since the movable contact portion 15n of the contact pin 15 is polished so as to provide a smooth surface, the plating layer of the IC lead 12b of the IC package 12 is prevented from being damaged more than necessary even in a case where the movable contact portion 15n is slid on the IC lead 12b.

Especially, since the surface roughness L of the movable contact portion 15n of the contact pin 15 is made smaller than the thickness of the palladium plating layer of the IC lead 12b of the IC package 12, the plating layer formed on the IC lead 12b is prevented from being broken by the movable contact portion 15n even if it is slid on the IC lead 12b and the base material thereof is prevented from being exposed outside.

Furthermore, the chemical polishing, by which any mechanical external force is not applied to the contact pin 15, makes it possible to polish even a small contact pin having a weak mechanical strength without deforming the same.

Still furthermore, according to the chemical polishing treatment, a number of contact pins 15 can be dipped and polished at the same time, improving the workability in comparison with a-mechanical polishing work by which the contact pins are to be polished one by one.

Still furthermore, when the contact pin 15 is polished, the thickness of the contact pin 15 including the elastic portion 15j is reduced. However, in the present invention, this thickness reduction is compensated by effecting the nickel plating to thereby ensure the elastic strength of the elastic portion 15j of the contact pin 15 and hence ensure the proper contacting pressure between the movable contact portion 15n and the IC lead 12b.

The IC socket 11 of the characters mentioned above will be used in the following manner.

At first, the lead portion 15b of the contact pin 15 of the IC socket 11 is preliminarily inserted into the insertion hole of the printed circuit board and then soldered, and in this condition, a plurality of such IC sockets 11 is arranged on the printed circuit board. Then, the IC package 12 is set by, for example, an automatic machine to thereby establish an electrical connection therebetween.

That is, the operation member 16 is depressed and lowered, with the IC package 12 being held, by the automatic machine against the urging force of both of the spring, not shown, and the contact pin 15. Then, as shown in FIG. 2, the operation piece 15p is pressed by the cam portion 16 of the operation member 16, the elastic portion 15j is then elastically deformed, the movable piece 15k is deformed obliquely upward and opened maximally, and the movable contact portion 15n is retired from the IC package insertion range.

Under this condition, the IC package 12 is released from the automatic machine and is mounted on the accommodation portion 13b of the socket body 13.

In this mounting operation, the IC package 12 is guided and positioned to the predetermined position by the guide portions 13c, and the IC lead 12b of the IC package 12 is surely placed on the upper surface 15q, as the contacting surface, of the stationary contact portion 15e of the contact pin 15.

Figure 3:
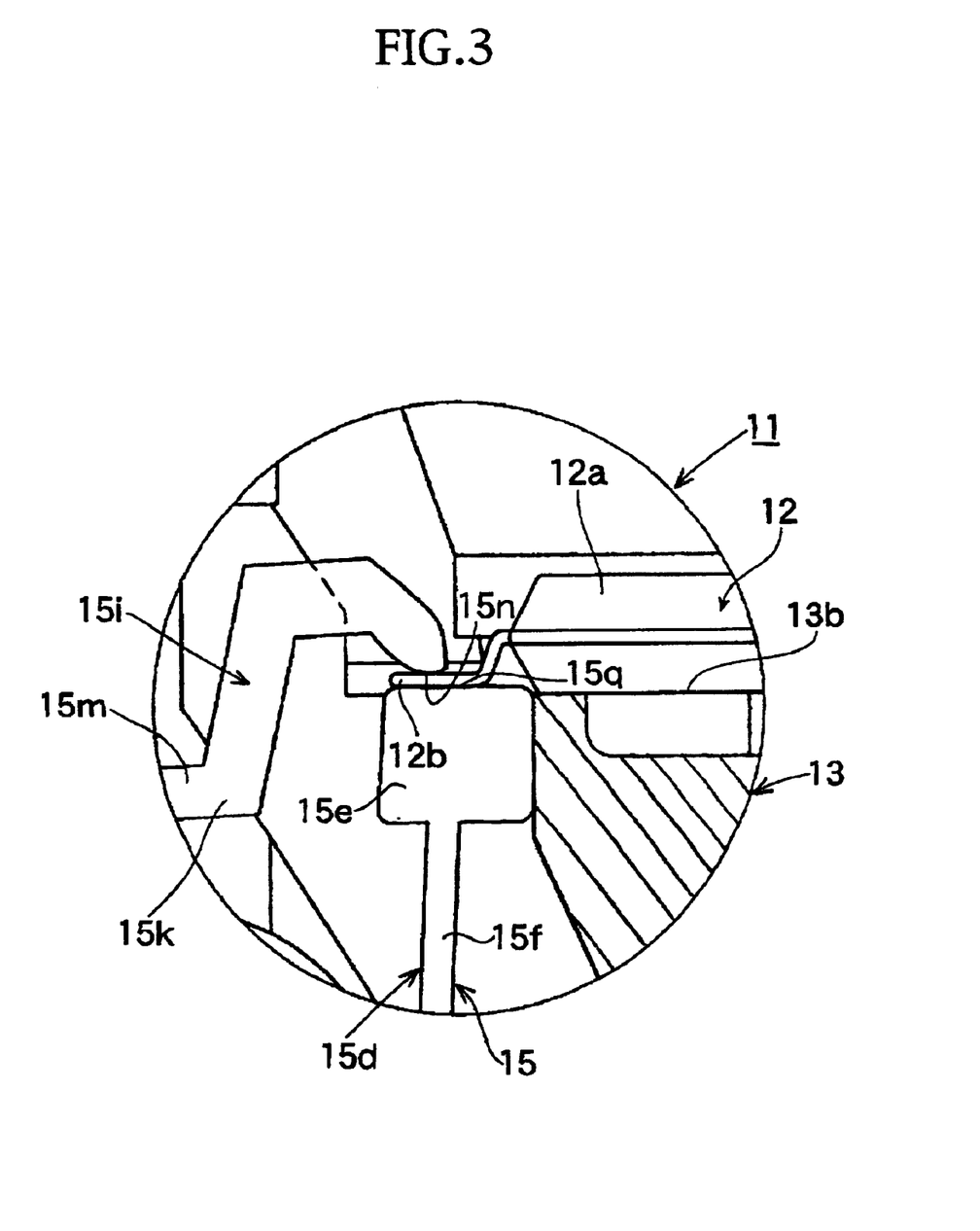
FIG. 3 is a sectional view, in an enlarged scale, of a portion of the contact pin of FIG. 1 showing a state that an IC lead is clamped.
Figure 4:
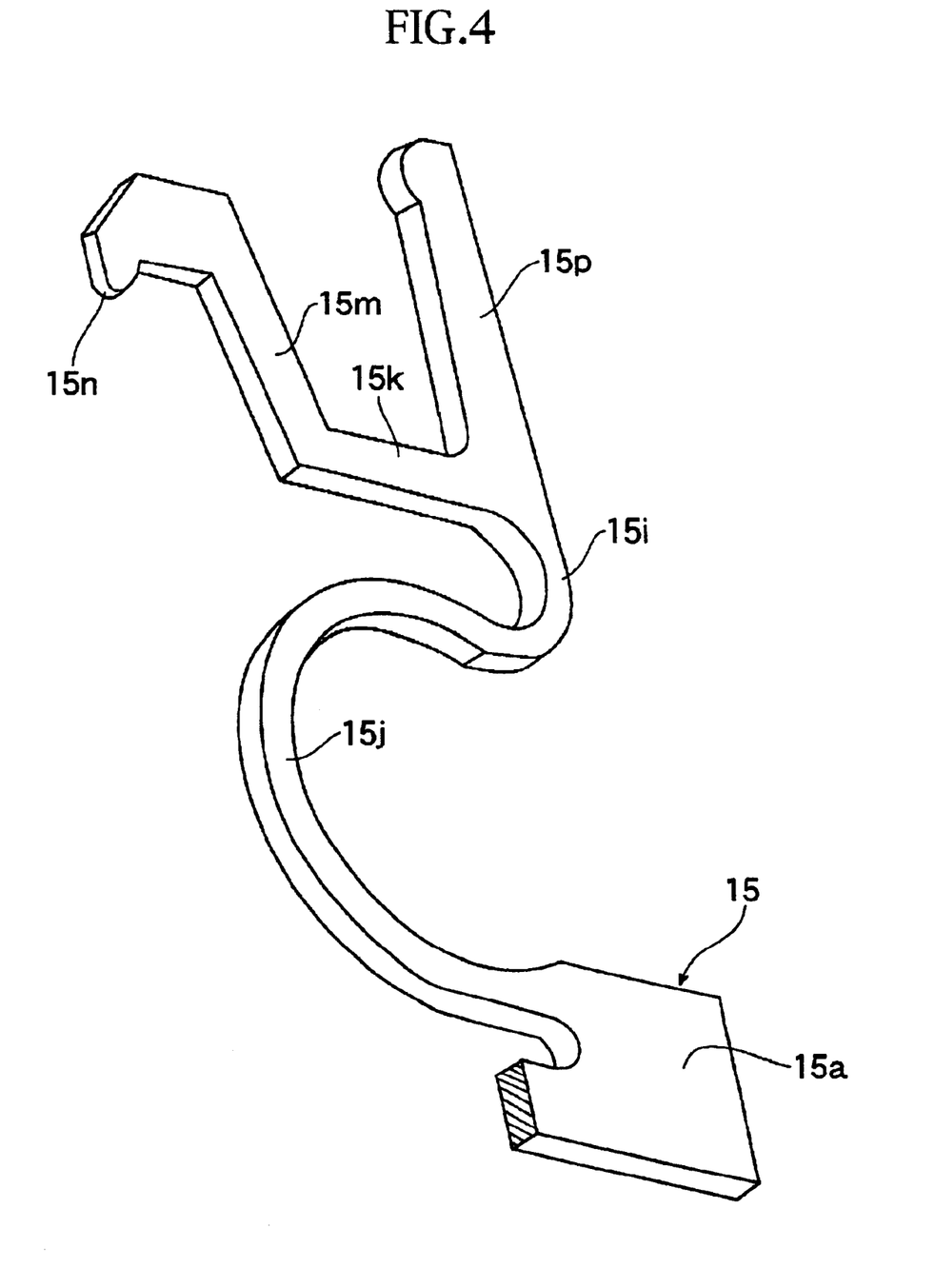
FIG. 4 is an enlarged perspective view of the movable piece of the contact pin of FIG. 1.
Figure 5:
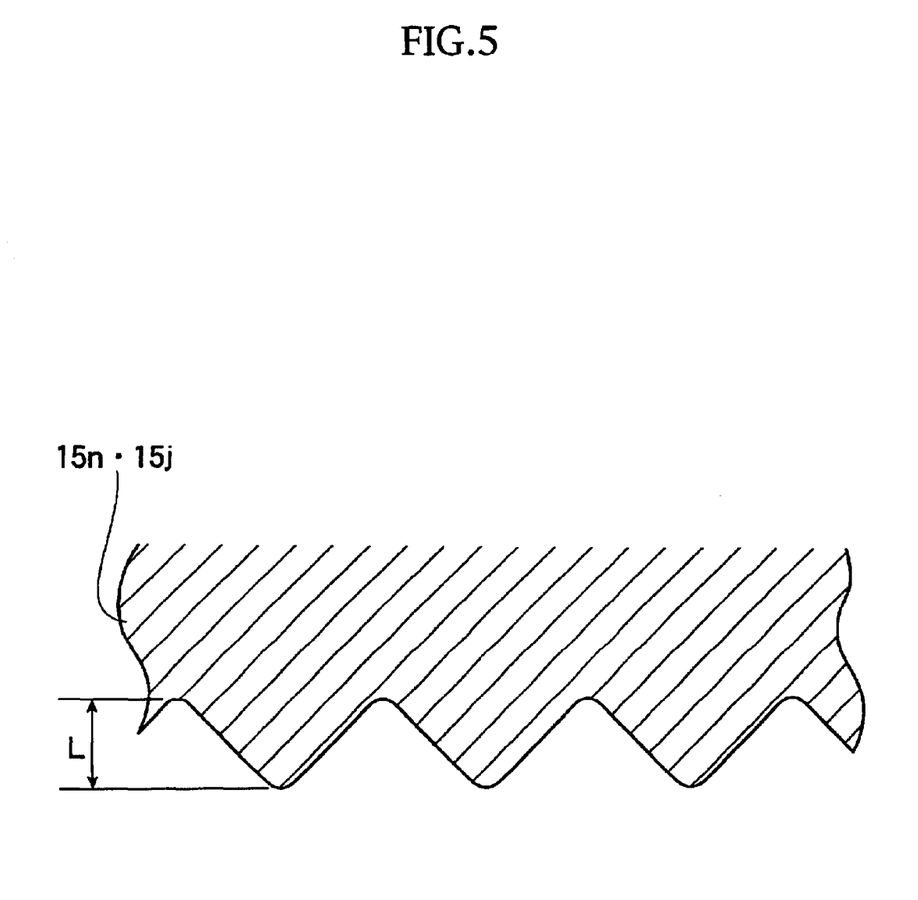
FIG. 5 is a view, in an enlarged scale, showing a surface roughness of the contact pin such as a portion of a movable contact portion thereof.

Thereafter, when the pressing force of the operation member 16 applied by the automatic machine is released, the operation member 16 is moved upward by the elastic force of the contact pin 15 and the urging force of the spring and the movable piece 15k of the contact pin 15 begins to return to its initial position. At a time when the operation member 16 has been moved upward to the predetermined position, the movable contact portion 15n of the contact pin 15 abuts against the upper surface of the predetermined IC lead 12b of the IC package 12 positioned in the manner mentioned above and, thereafter, wiped by a predetermined amount, whereby this IC lead 12b is clamped between the movable contact portion 15n and the stationary contact portion 15e to thereby establish the electrical connection therebetween as shown in FIG. 3.

As mentioned above, at a time of mounting or dismounting the IC package 12, the elastic portion 15j of the movable contact piece 15*i* of the contact pin 15 is elastically deformed repeatedly through the vertical movement of the operation member 16. According to this invention, however, the elastic portion 15*j* is chemically polished as mentioned above to provide a smooth flat surface thereof, so that, when a load is applied repeatedly to the elastic portion, the load is not concentrated to any one portion, and thus, the durability in use thereof can be improved.

Further, it is to be noted that the present invention is not limited to the described embodiment and many other changes and modifications may be made without departing from the scopes of the appended claims.

For example, although, in the described embodiment, the present invention is applied to an IC socket as a socket for electrical parts, the present invention will be applied to other devices or like.

Moreover, although, in the described embodiment, the chemical polishing is utilized as polishing means, other polishing method or treatment such as electrolytic polishing, sand blasting, or shot peening may be utilized. Still furthermore, although, in the described embodiment, the contact pin 15 is entirely polished, only the contact portion 15*n* thereof may be polished. Further, in this embodiment, no other portion is decreased in thickness and hence in strength.

Still furthermore, in the present embodiment, although the contact pin 15 is so-called a two-point type contact pin provided with the stationary contact piece 15*d*, one-contact type contact pin having only the movable contact piece 15*i* may be equivalently utilized.

Still furthermore, in the described embodiment, although the present invention utilizes the palladium plating layer meeting the lead-free requirement of the solder, the present invention is not limited to this described embodiment and the present invention can utilize the IC lead to which a conventional solder plating is applied. In such case, since the amount of the solder transferring to the contact portion 15*n* is reduced, the stable contacting condition between the movable contact portion 15*n* and the IC lead 12*b* can be maintained for a long term.

What is claimed is:

1. A contact pin for an electrical part formed from a metal material having conductivity and having a contact portion formed from a metal having conductivity,
   wherein the contact portion contacts and slides on a surface layer of the terminal,
   wherein the contact portion is polished to have a surface roughness smaller than a predetermined value so as to prevent the surface layer of the terminal from being broken by the contact portion when the contact portion slides on the terminal.

2. The contact pin according to claim 1, wherein said contact portion is polished without applying any external force thereto.

3. The contact pin according to claim 1, wherein said surface of said contact portion is polished by a chemical polishing.

4. The contact pin according to claim 1, wherein the contact pin is a punched thin metal plate.

5. The contact pin according to claim 1, wherein a nickel plating is formed on the polished surface.

6. The contact pin according to claim 5, wherein gold plating is formed over the nickel plating on the polished surface of the contact pin.

7. The contact pin according to claim 1, wherein a surface of the terminal contacted by the polished surface of the contact portion includes a plating layer having a thickness of not more than 1 $\mu$m.

8. The contact pin according to claim 7, wherein said contact portion polished surface has a roughness which is smaller than the thickness of the plating layer formed on the terminal.

9. The contact pin according to claim 1, further comprising an elastic portion having a polished surface with a roughness of not more than 1 $\mu$m.

10. The contact pin according to claim 9, wherein the polished surface of the elastic portion includes a nickel plating to strengthen the elastic portion.

11. A contact pin for a socket for an electrical part formed from a metal material having conductivity, comprising:
    a base portion;
    a stationary piece extending from the base portion and contacting the electrical part; and
    a movable piece extending from the base portion and contacting the electrical part,
    said movable piece including an elastic portion and a contact portion both contacting the electrical part, and said contact portion sliding on a surface layer of the terminal and said contact portion having a surface that is polished to have a surface roughness smaller than a predetermined value so as to prevent the surface layer of the terminal from being broken by the contact portion when the contact portion slides on the terminal,
    wherein said contact portion is made from a metal material having conductivity.

12. The contact pin according to claim 11, wherein said surface of said contact portion is polished by a chemical polishing.

13. The contact pin according to claim 11, wherein the contact pin is a punched thin metal plate.

14. The contact pin according to claim 11, wherein a portion of said electrical part which is contacted by said contact portion includes a plating layer, and said contact portion polished surface roughness is smaller than the thickness of the plating layer formed on the electrical part.

15. The contact pin according to claim 14, wherein the plating layer on the electrical part is not more than 1 $\mu$m thick.

16. The contact pin according to claim 11, wherein the polished surface of the contact pin has a nickel plating thereon.

17. The contact pin according to claim 16, wherein gold plating is formed over the nickel plating on the polished surface of the contact pin.

18. The contact pin according to claim 11, wherein said elastic portion has a polished surface with a roughness of not more than 1 $\mu$m.

19. The contact pin according to claim 18, wherein the polished surface of the elastic portion includes a nickel plating to strengthen the elastic portion.

20. A socket for an electrical part having an electrically conductive terminal, comprising:
    a socket body to which the electrical part is mounted;
    an operation member provided for the socket body to be vertically movable in an operative state, said operation member being formed with a cam portion;
    a contact pin provided for the socket body, said contact pin being formed from a metal material having conductivity and including an elastic portion, a contact portion formed on a tip end portion of the elastic portion and adapted to electrically contact and slide on the terminal of the electrical part, and an operation piece to be pressed by said cam portion of the operation member, said contact portion including a surface that is polished to have a surface roughness smaller than a predetermined value so as to prevent the surface layer of the terminal from being broken by the contact portion when the contact portion slides on the terminal, said elastic portion being elastically deformed when the operation member is moved downward and the operation piece of the contact pin is pressed by the cam portion of the operation member to thereby separate the contact portion from the terminal of the electrical part.

21. The socket for an electrical part according to claim 20, wherein said socket is an IC socket provided with a number of contact pins and said electrical part is an IC package provided with a number of IC leads as the terminals.

22. The contact pin according to claim 20, wherein the contact pin is a punched thin metal plate.

23. The contact pin according to claim 20, wherein the polished surface of the contact pin has a nickel plating thereon.

24. The contact pin according to claim 23, wherein gold plating is formed over the nickel plating on the polished surface of the contact pin.

25. The contact pin according to claim 20, wherein a portion of said terminal which is contacted by said contact portion includes a plating layer, and said contact portion polished surface roughness is smaller than the thickness of the plating layer formed on the terminal.

26. The contact pin according to claim 25, wherein the plating layer on the terminal is not more than 1 $\mu$m thick.

27. The contact pin according to claim 20, wherein said elastic portion has a polished surface with a roughness of not more than 1 $\mu$m.

28. The contact pin according to claim 27, wherein the polished surface of the elastic portion includes a nickel plating to strengthen the elastic portion.

* * * * *